United States Patent
Fujimura et al.

(10) Patent No.: US 7,612,495 B2
(45) Date of Patent: Nov. 3, 2009

(54) DISPLAY DEVICE

(75) Inventors: Hiroshi Fujimura, Kanagawa (JP); Masumitsu Ino, Kanagawa (JP)

(73) Assignee: Sony Corporation, Tokyo (JP)

( * ) Notice: Subject to any disclaimer, the term of this patent is extended or adjusted under 35 U.S.C. 154(b) by 685 days.

(21) Appl. No.: 11/108,738

(22) Filed: Apr. 19, 2005

(65) Prior Publication Data

US 2005/0253507 A1 Nov. 17, 2005

(30) Foreign Application Priority Data

May 17, 2004 (JP) ............................. 2004-145873

(51) Int. Cl.
*H01J 1/62* (2006.01)
(52) U.S. Cl. ........................ 313/503; 313/505
(58) Field of Classification Search ............... 313/506, 313/498–512; 315/169.1, 169.3; 428/690–691, 428/917; 438/26–29, 34, 82; 257/40, 72, 257/98–100, 642–643, 759; 427/66, 532–535, 427/539

See application file for complete search history.

(56) References Cited

U.S. PATENT DOCUMENTS

| | | | | |
|---|---|---|---|---|
| 4,689,522 A | * | 8/1987 | Robertson | 313/506 |
| 5,053,675 A | * | 10/1991 | Thioulouse | 313/505 |
| 6,664,730 B2 | * | 12/2003 | Weaver | 313/504 |
| 6,955,951 B2 | * | 10/2005 | Hashimoto | 438/149 |
| 7,027,044 B2 | * | 4/2006 | Lee | 345/211 |
| 7,123,251 B2 | * | 10/2006 | Ishii et al. | 345/211 |
| 2004/0043140 A1 | * | 3/2004 | Jagannathan et al. | 427/66 |
| 2004/0170927 A1 | * | 9/2004 | Pichler | 430/311 |
| 2004/0195963 A1 | * | 10/2004 | Choi et al. | 313/504 |

FOREIGN PATENT DOCUMENTS

| | | |
|---|---|---|
| JP | 09-115673 | 5/1997 |
| JP | 2001-109397 | 4/2001 |
| JP | 2002-040961 | 2/2002 |
| JP | 2002-108252 | 4/2002 |
| JP | 2002-318556 | 10/2002 |
| JP | 2003-066868 | 3/2003 |

(Continued)

OTHER PUBLICATIONS

Japanese Office dated Feb. 26, 2008 for corresponding Japanese Application No. 2004-145873.

*Primary Examiner*—Peter J Macchiarolo
*Assistant Examiner*—Donald L Raleigh
(74) *Attorney, Agent, or Firm*—Rader, Fishman & Grauer PLLC

(57) ABSTRACT

A display device able to maximize an area of a luminous region in a pixel and realize an image display in bright and high-definition, wherein luminous elements having a first electrode defining a luminous region; a transparent second electrode facing and arranged to the first electrode; a luminous layer arranged between the first electrode and the second electrode are arranged in a first and second direction in matrix, a plurality of first electrode interconnections extending in the first direction and connected to a plurality of the first electrodes arranged in the first direction is arranged in the display region, and a plurality of second electrode interconnections arranged in parallel to the first electrode to extend in the second direction and commonly connected to a plurality of the second electrodes arranged in the second direction is also arranged.

15 Claims, 6 Drawing Sheets

FOREIGN PATENT DOCUMENTS

| | | |
|---|---|---|
| JP | 2003-303687 | 10/2003 |
| JP | 2004-029755 | 1/2004 |
| JP | 2004-062198 | 2/2004 |
| JP | 2004-071365 | 3/2004 |
| JP | 2004-111369 | 4/2004 |
| JP | 2004-133411 | 4/2004 |
| JP | 2004-139970 | 5/2004 |

* cited by examiner

DISPLAY DEVICE

CROSS REFERENCES TO RELATED APPLICATIONS

The present invention contains subject matter related to Japanese Patent Application JP 2004-145873 filed in the Japanese Patent Office on May 17, 2004, the entire contents of which being incorporated herein by reference.

BACKGROUND OF THE INVENTION

1. Field of the Invention

The present invention relates to an organic electroluminescence display device for example.

2. Description of the Related Art

An active type organic electroluminescence display device has a configuration referred to a bottom emission type in related art.

The configuration is characterized in that light of a luminous layer is emitted from a transparent substrate side formed with a thin film transistor performing a pixel drive to obtain an image. The luminous layer is sandwiched by a transparent electrode such as ITO formed at the transparent substrate side and a counter metal electrode in the respective pixels, and usually the counter metal electrode is formed as a common electrode and covers the entire reverse surface side of a display region.

However, in the case of the bottom emission type, an area of the luminous layer is restricted due to a pixel transistor formed on the transparent substrate and an interconnect thereof, so that it is difficult to obtain a bright display due to its configuration.

Since an optical sensor, magnetic sensor or other circuit is formed in the pixel by using a thin film process, a transistor and interconnection for an additional circuit thereof formed in the pixel block off a light path. Therefore, the area of the luminous layer becomes reduced, so that it is more difficult to obtain the bright display.

SUMMARY OF THE INVENTION

The disadvantage of the bottom emission type can be improved by making a luminous configuration a top emission type. The top emission type differs from the bottom emission type, and it does not block off the light path emitted from the luminous layer by the pixel transistor or interconnection, so that it can be made the area of the luminous layer in large to supply a brighter display.

However, recently it is usual to be required with a high resolution for a display device, so that the area of the respective pixels is made ultra fine. Consequently, only an advantage of having the top emission type configuration is not sufficient. Namely, if the area of the luminous layer in the respective pixels is formed so as to make it the maximum, it may be possible to provide an electroluminescence display device in high-efficiency, brightness and high-definition. In other word, in order to overcome the above disadvantage according to the top emission type configuration, a ratio of the area for a power supply interconnection in the display area (specifically, a cathode interconnection in explanation below) to the area for the respective pixel has to made small efficiently.

Simultaneously, since a current flowing into the respective pixel may increase if the luminous area is made large, it may be necessary to consider so as to not cause an unevenness of the luminance due to a potential drop which occurs in the interconnection. In particular, in the interconnection of a cathode bus line connected to the cathode interconnection, it may be necessary to consider so as to not cause a potential inclination.

Similarly to the cathode interconnection and the cathode bus line, the same amount of current flows into an anode interconnection or an anode bus line. So, similarly it is necessary to consider the same.

In a display device, it is desirable to maximize an area of a luminous region in a pixel, achieving a display in bright and high-definition.

According to an embodiment of the present invention, there is provided with a display device having a first electrode formed on a substrate and defining a luminous region; a transparent second electrode facing and arranged to the first electrode; a luminous layer arranged between the first electrode and the second electrode; and a display region in which luminous elements having the first electrode, the second electrode and the luminous layer are arranged in first and second directions in matrix and light from the luminous layer is obtained from the reverse side of the substrate, wherein the display region includes a plurality of first electrode interconnections extending in the first direction and respectively connected to a plurality of the first electrodes arranged in the first direction, and a plurality of second electrode interconnections arranged in parallel with respect to the first electrode to extend in the second direction and respectively connected to a plurality of the second electrodes arranged in the second direction.

The display device of an embodiment of the present invention has a plurality of the first electrodes arranged in the second direction in a single pixel.

And the second electrode interconnection which is arranged in parallel with respect to the first electrode defining the luminous region is connected to a plurality of the second electrodes arranged in the second direction.

Therefore, a single pixel is not formed with the second electrode interconnection, which is arranged in parallel with respect to the first electrode, between the first electrodes, so that the first electrode in the pixel can make its area large.

According to the other embodiment of the present invention, there is provided with a display device having a first electrode; a second electrode facing and arranged to the first electrode; a luminous layer arranged between the first electrode and the second electrode; and a display region in which luminous elements having the first electrode, the second electrode and the luminous layer are arranged in a first and second direction in matrix, wherein the display region includes a plurality of first electrode interconnections extending in the first direction and connected respectively to a plurality of the first electrodes arranged in the first direction, and a plurality of second electrode interconnections extending in the second direction and connected respectively to a plurality of the second electrodes arranged in the second direction.

In the display device of an embodiment of the present invention, the first electrode interconnection connected to the first electrode of the luminous element and the second electrode interconnection connected to the second electrode of the same are crossed, so that the area of the respective luminous elements can be made large.

According to the present invention, it is provided with a display device able to display an image in bright and high-definition by maximizing the area of the luminous region in the pixel.

BRIEF DESCRIPTION OF THE DRAWINGS

These and other features of the present invention will be described in more detail with reference to the accompanying drawings, in which.

DESCRIPTION OF THE PREFERRED EMBODIMENTS

Next, preferred embodiments of the present invention will be explained with reference to the drawings.

First Embodiment

Figure 1:
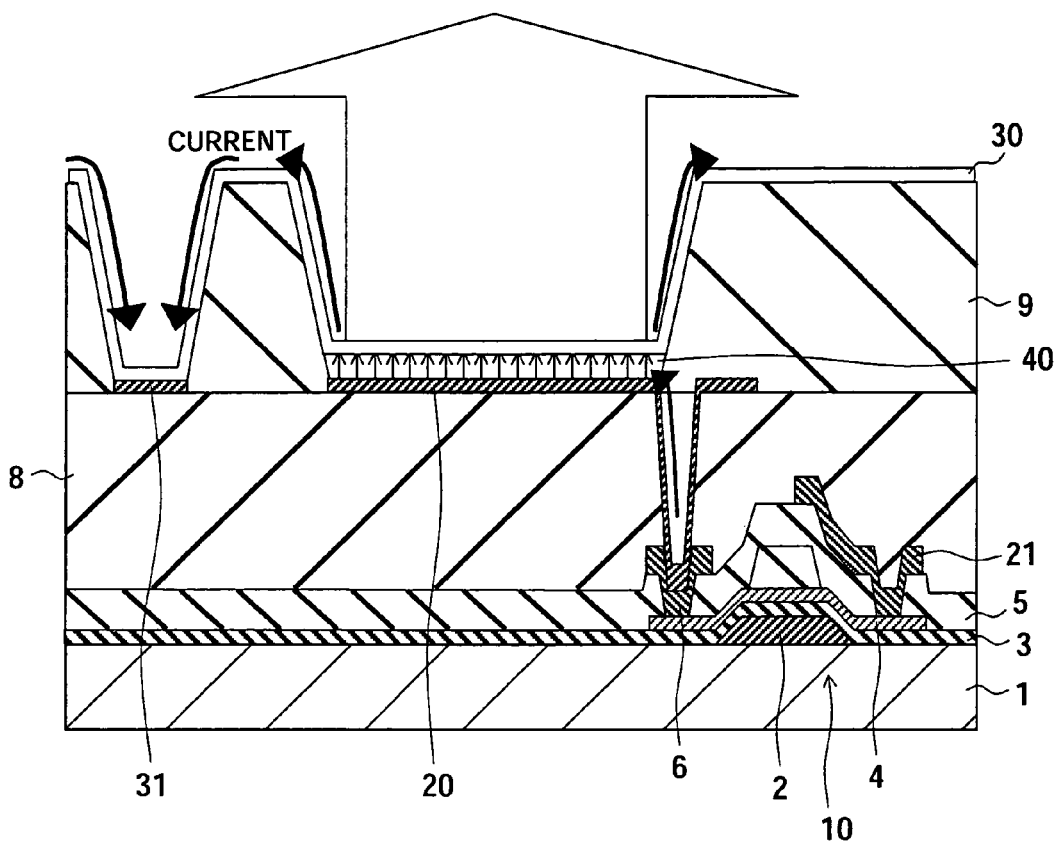
FIG. 1 is a general cross-sectional view of a display device according to an embodiment of the present invention.

FIG. 1 is a general cross-sectional view of an organic electroluminescence display device according to the present embodiment.

The organic electroluminescence display device shown in FIG. 1 has an active matrix type configuration which drives a pixel by a thin film transistor 10 (hereinafter, referred to a "TFT") formed on an insulation substrate 1.

The insulation substrate 1 is formed on its surface with a gate electrode 2 and the gate electrode 2 is covered with a gate insulation film 3 on the insulation substrate 1. The gate electrode 2 is formed with a semiconductor layer 4 of for example polysilicon via the gate insulation film 3. The semiconductor layer 4 is formed on its surface with an insulation film 5 and the insulation film 5 is formed on its surface with a drain electrode 6 which reaches the semiconductor layer 4 and an anode interconnection 21 to be a source electrode which reaches the semiconductor layer 4. A TFT 10 of, for example, a p-channel transistor is formed by the gate electrode 2, the drain electrode 6, and the source electrode (the anode interconnection 21).

The TFT 10 is covered with an interlayer insulation layer 8. The interlayer insulation film 8 is formed on its surface with an anode electrode 20 which connects to the drain electrode 6 of the TFT 10. The interlayer insulation film 8 is also formed on its surface with a cathode interconnection 31 as a same layer to the anode electrode 20.

The anode electrode 20 and the cathode interconnection 31 are made from, for example Ag, Al, Cr, Cu, Fe, Ti, Mo, Mg, Sm, ITO (Indium Tin Oxide), or alloy thereof which two or more of the above metal materials are mixed in specific ratio.

The interlayer insulation film 8 except regions formed with the anode electrode 20 and the cathode interconnection 31 is formed on its surface with an interlayer insulation film 9. And the anode electrode 20 is formed on its surface with a luminous layer 40 of an organic electroluminescence material.

The luminous layer 40, the interlayer insulation film 9 and the cathode interconnection 31 are covered with a cathode electrode 30 of ITO or other transparent electrode materials. The cathode electrode 30 is arranged on its surface with a transparent insulation substrate which is omitted in the drawing.

The organic electroluminescence display device according to the present embodiment employs a top emission type configuration in which light emitted from the luminous layer 40 is obtained from the reverse side of the insulation substrate 1, on which the TFT 10 is formed and applied to an image display.

Figure 2:
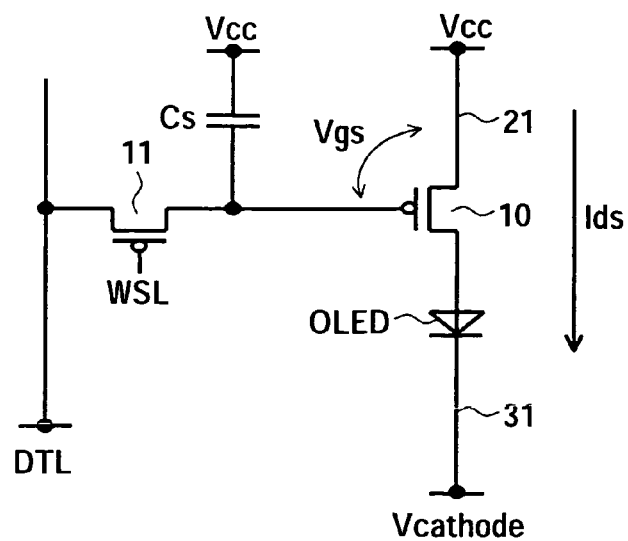
FIG. 2 is a circuit diagram of an example of a pixel circuit according to an embodiment of the present invention.

FIG. 2 is a circuit diagram of an example of a pixel circuit.

The pixel circuit shown in FIG. 2 has a most simple circuit configuration in circuits which have been proposed, namely it is a two-transistor drive type circuit.

A luminance element including the luminous layer 40 of the organic electroluminescence material, the cathode electrode 30 and the anode electrode 20 emits light with a luminance corresponding to a supplied current in the respective pixels and functions as a diode (OLED: Organic Light Emitting Diode) in the electric circuit. Note that, the luminous element does not require rectification.

The pixel circuit shown in FIG. 2 has the TFT (pixel transistor) 10 and a TFT 11, capacitor Cs and the luminous element OLED. In FIG. 2, a "DTL" is indicated as a data line and a "WSL" is indicated as a scan line.

The source electrode of the TFT 10 is supplied with a $V_{cc}$ power supply (power supply of a higher potential side) via the anode interconnection 21. A current flowing from the cathode electrode of the luminous element OLED is discharged via the cathode interconnection 31 to a $V_{cathode}$ power supply (power supply of a lower potential side).

An operation of the pixel circuit shown in FIG. 2 will be described in the following.

The scan line WSL is made a selected state (in this case, it is a low level) and the data line DTL is applied with a write voltage $V_{data}$ corresponding to an image signal. Consequently, the TFT 11 is turned on to make the capacitor Cs charge or discharge and a gate potential of the TFT 10 becomes $V_{data}$ (ST1).

The scan line WSL is made an unselected state (in this case, it is a high level), so that the data line DTL and the TFT 10 are separated electrically, and the gate potential of the TFT 10 is stably maintained by the capacitor Cs (ST2).

A current which flows into the TFT 10 and the luminous element OLED becomes an amount corresponding to a potential $V_{gs}$ between the gate and source of the TFT 10. Consequently, the luminous element OLED continuously emits light at a luminance corresponding to the current (ST3). Due to this, a current corresponding to the image signal is supplied to the luminous element OLED and the image is displayed.

As the above step ST1, the operation in which the scan line WSL is selected and luminous data supplied to the data line DTL is supplied into the pixel is referred to as a "write operation". In the pixel circuit shown in FIG. 2 as mentioned above, if the write operation of $V_{data}$ is performed, the luminous element OLED may continue an emission at a specific luminance until a next write operation.

The cross-sectional view in FIG. 1 describes only the luminous element and the circumference of the pixel transistor for simplification. The anode interconnection 21 supplying the $V_{cc}$ power supply to the respective pixels and the data line DTL supplying an image signal to the respective pixels shown in FIG. 2 are both extend in the longitudinal direction of an image display.

One reason is that a horizontal drive circuit is arranged at upper side, lower side or both sides of the image display on the organic electroluminescence display device in the present embodiment, which is similar to a liquid crystal display device or other flat panel display, in that the data line of the horizontal drive circuit extends in the longitudinal direction of the image display. In order to reduce an interconnection resistance, the data line DTL should be formed by a single metal layer if possible. In particular, an interconnection arrangement so as to pass two layers by a contact hole in the display region should be avoided.

Similarly, the anode interconnection 21 has to be supplied with large amount of current to emit light in a pixel, so that it should be formed by a single metal layer if possible. In particular, the interconnection arrangement so as to pass two layers by a contact hole in the display region should be avoided.

In order to simplify a producing process, the anode interconnection 21 and the data line DTL are preferably formed by a single patterning of a metal film (for example, Ti/Al) on the insulation film. As above mentioned, the anode interconnection 21 and the data line DTL are both extended in the longitudinal direction (a first direction) of the image display preferably, and not arranged crosswise.

Note that, color pixels such as a red pixel (R), a green pixel (G) and a blue pixel (B) are repeated in lateral direction (a second direction) of the image display, for example R, G, B, R, . . . Further, the gate interconnection which drives a pixel transistor is extended in the right and left directions from a vertical drive circuit provided at a right or left side of the image display, in order to scan the image display in the longitudinal direction successively which is similar to a liquid crystal display device.

Such that the anode interconnection 21 and data line DTL are together formed on the same layer (the insulation film), in order to simplify the producing process, the anode electrode 20 and the cathode interconnection 31 are preferably formed on the same layer (the interlayer insulation film 8) simultaneously as shown in FIG. 1. As a material of the anode electrode 20 and the cathode interconnection 31, it is preferably an alloy of Ag, Cr, and Sm as mentioned above. Since the alloy material has a high reflection, if it is used as an electrode under the luminous layer 40, it has both a high efficiency obtaining light of the luminous layer 40 to the display surface side and a characteristic to be processed easily.

In the present embodiment, when the anode electrode 20 and the cathode interconnection 31 are formed on the same layer, attention is paid to the arrangement thereof in order to maximize the area of the luminous layer in the respective pixels.

In the display device according to the present embodiment, the luminous layers of the electroluminescence materials of the respective RGB colors are repeatedly arranged such as R, G, B, . . . for example in the lateral direction of the image display region. So the anode electrode 20 is arranged similarly, so that it is aligned in matrix in the entire display region. Therefore, the cathode interconnection 31 can be arranged such as the following two: one is extended in the lateral direction of the image display in strips (hereinafter, referred to as "lateral interconnection"); the other is extended in the longitudinal direction (hereinafter, referred to as "longitudinal interconnection").

Figure 3:
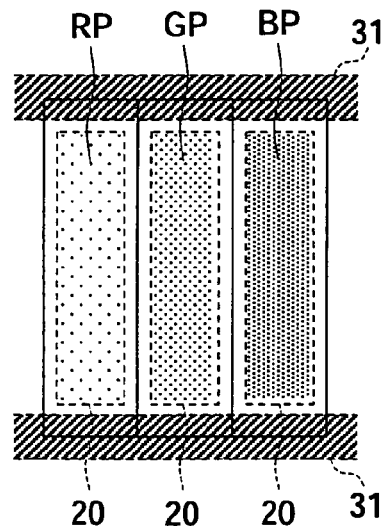
FIG. 3 is a view of an arrangement making a cathode interconnection a horizontal direction.
Figure 4:
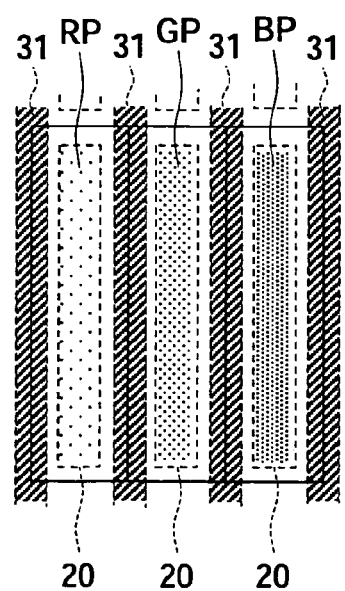
FIG. 4 is a view of an arrangement making a cathode interconnection a vertical direction.

FIG. 3 is a view of an arrangement making the cathode interconnection 31 the lateral interconnection and FIG. 4 is a view of an arrangement making the cathode interconnection 31 the longitudinal interconnection.

The luminous layer and the anode electrode in the respective pixels of a red pixel RP, green pixel GP and blue pixel BP (hereinafter, referred to as "RGB color pixel") are assumed to be the same shapes. In both the lateral interconnection and the longitudinal interconnection, the entire luminous layer is assumed to emit without waste. Note that, the lateral interconnection and the longitudinal interconnection are assumed to have the same condition in terms of arranging a single cathode interconnection 31 for every column or row of the respective color pixels.

Then, the maximum size of the luminous area able to be achieved in both arrangements will be examined. For example, if assuming a diagonal 2.4 inches QVGA panel (320 (lateral)×RGB×240 (longitudinal) dots), the size of the RGB color pixel may be almost 0.051 mm×0.153 mm. If the widths of the cathode interconnection in the respective pixels are equal to 0.01 mm, a ratio of an area of the cathode interconnection to the respective pixels may be 10/51 in the longitudinal interconnection and 10/153 in the lateral interconnection. In order to prevent an electric short between the anode electrode 20 and the cathode electrode 31, or adjoining color pixels, a width of an interval of the anode electrode 20 and the cathode interconnection 31 has to be very strict. However, the area for the interval is smaller than an area for a width of the interconnections, so they are omitted. Therefore, the maximum area able to be assigned to the luminous layer in the respective color pixels becomes almost 41/51=80.4% in the longitudinal direction and 143/153=93.5% in the lateral direction. Consequently, the lateral interconnection can enlarge the area of the luminous layer by almost 20%. Namely, the luminance can be improved by almost 20%.

In this way in the present embodiment, the anode interconnection 21 is made the longitudinal interconnection, the cathode interconnection 31 is made the lateral interconnection and they are crossed, so that the display device has the advantage of the top emission type mentioned above, and additionally it maximizes the area of the luminous layer in the pixel. As a result, a display device in high luminance can be provided with respect to requirement for high-definition and narrow pitch.

To make the cathode interconnection 31 the lateral interconnection is superior in terms of an image quality. Namely, it is evident in FIG. 4, in the case of the longitudinal interconnection, since the shape of the luminous layer of the respective RGB color pixels RP, GP and BP is restricted to be a rectangle which is longer in the longitudinal direction, the interval between the respective RGB color pixels is made wide and an image display has rough transitions and discontinuous tone for human visual. On the other hand, it is evident in FIG. 3, in the case of the lateral interconnection, since the respective RGB color pixels RP, GP and BP are closely arranged, the image display is able to have smooth transitions and continues tone for human visual.

Next, a technique for securing image uniformity by a resistance of a bus line will be described. The bus line is defined as a power supply interconnection provided at an outside of the display region. The cathode interconnection (or the anode interconnection) is connected with its both sides to a cathode bus line (or an anode bus line) at the outside of the display region.

The top emission type organic electroluminescence display device in the present embodiment has the anode interconnection 21 extending in the longitudinal direction of the image display and the cathode interconnection 31 extending in the lateral direction of the image display. So the anode bus line is arranged at the upper side and lower side of the display region and the cathode bus line is arranged at the right side and left side of the image display. The cathode bus line (or anode bus line) is provided for preventing a gradation tone of the image display which is conspicuous in a white display, which can be explained by blow specifically. Blow, an effect of the bus line will be described. If the cathode bus line is examined, the anode bus line will have the same effect, so that the only cathode bus line will be described hereinafter.

[Example of First Interconnection of Bus Line]

Figure 5:
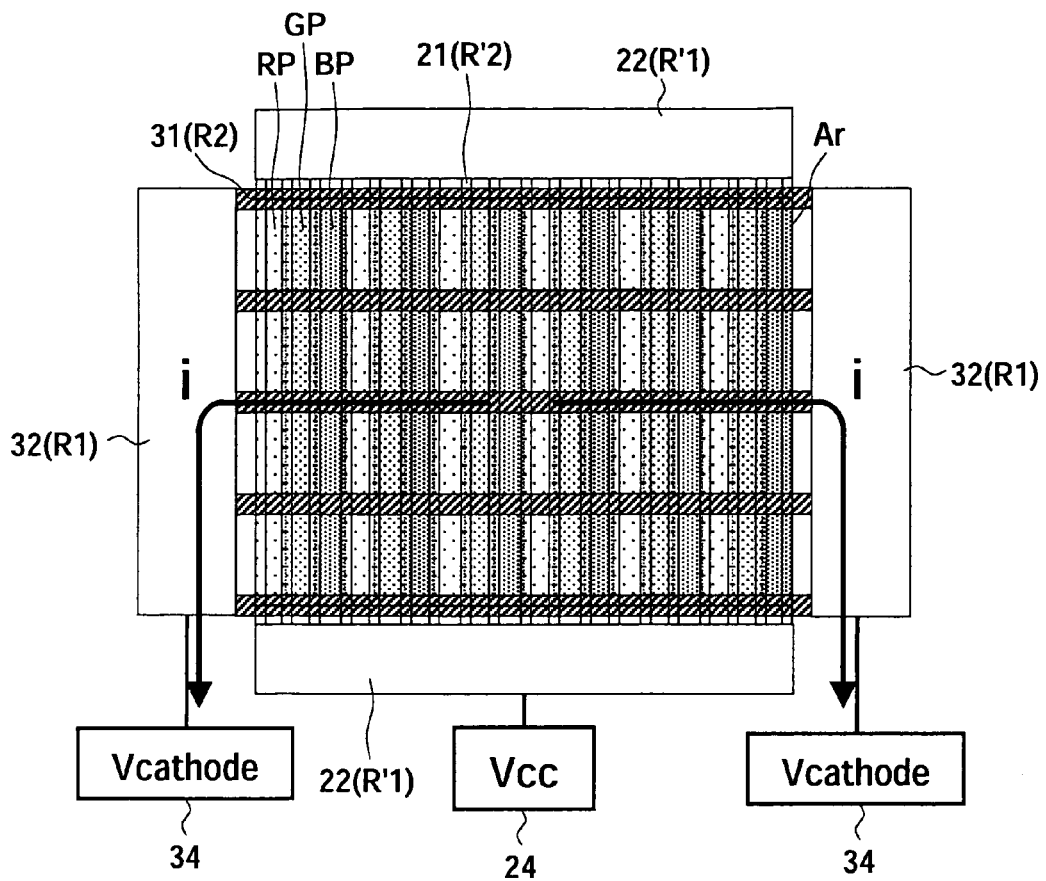
FIG. 5 is a view of an example of a first interconnection of a cathode bus line and an anode bus line.

FIG. 5 is a view of an example of a first interconnection of the cathode bus line and the anode bus line.

In FIG. 5, two first cathode bus lines 32 which are respectively connected to one of the right and left sides of a plurality of the cathode interconnections 31, and two power supply terminals 34 which are connected to the respective first cathode bus lines 32 are provided at an area outside of a display region Ar. And two first anode bus lines 22 which are respectively connected to one of the upper and lower sides of the anode interconnections 21, and a power supply terminal 24 which is connected to the lower side of the first anode bus line 22 are provided.

The configuration shown in FIG. 5 has characteristics of arranging the two first cathode bus lines 32 with similar shape at the right and left sides of the display region Ar, and the power supply terminals ($V_{cathode}$) 34 at the lower side of the respective first cathode bus lines 32. Note that, the power supply terminals 34 are arranged at the insulation substrate side of a display panel and worked as a terminal for connecting to an outer power supply which is placed at an outside of the display panel.

The current flowing into the pixel in the above configuration flows from the anode interconnection 21 extended in the longitudinal direction of the image display to the anode electrode, the organic luminous layer, the cathode electrode of the respective pixels, the cathode interconnection 31 extended in the lateral direction of the image display, the first cathode bus line 32 and the power supply terminal 34 successively. Since the power supply terminals 34 are arranged at the lower side of the respective cathode bus lines 32, as shown by an arrow in the drawing, the current flowing from the respective pixels in a half portion of the left side of the image display flows into the cathode interconnection 31 in the left direction of the image display and the current flowing from the respective pixels in a half portion of the right side of the image display flows into the cathode interconnection 31 in the right direction of the image display. Then, the current thereof flows via both sides of the respective first cathode bus lines 32 to the respective power supply terminals 34.

Figure 6:
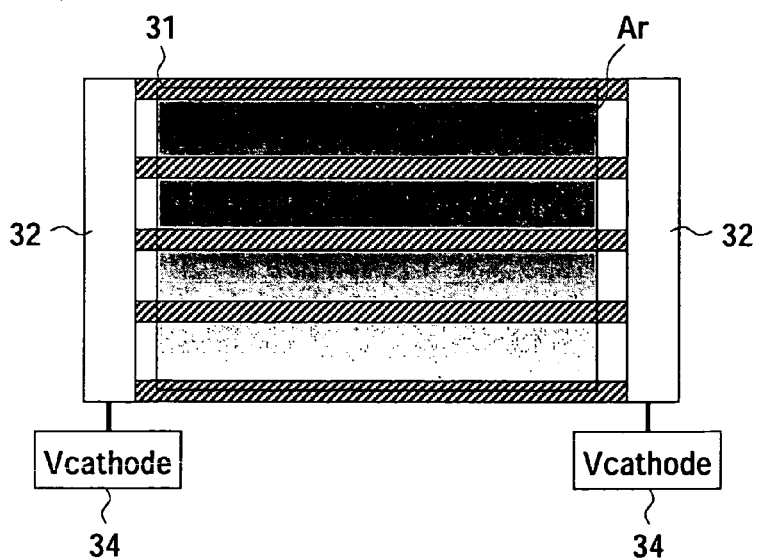
FIG. 6 is a schematic view of a gray-scaled display by the interconnection shown in FIG. 5.

In the present embodiment, it is desired to maximize the luminous intensity of the respective pixels. In particular in the case of the white display in which large current flows into the pixel, since the current from the respective cathode interconnections 31 is superposed at the first cathode bus lines 32, the potential at the upper portion of the image display will become high if the resistance of the first cathode bus line 32 is high. Consequently a grayscale is caused in the up and low direction of the image display as shown in FIG. 6. On the other hand, the resistance of the cathode interconnection 31 is designed to be sufficiently small so as that the gradation tone along it does not occur in the white display. Namely, it is a disadvantage that the above gradation tone is caused by a current concentration in the first cathode bus lines 32. In order to reduce the resistance of the first cathode bus lines 32, the line width thereof may be made widely. However, the first cathode bus lines 32 formed at outside of the display region Ar lead to an increase in the width of the frame of the display device. Consequently, the width of the frame has to be restricted to a minimum which is necessary to prevent losing commercial value.

Figure 7:
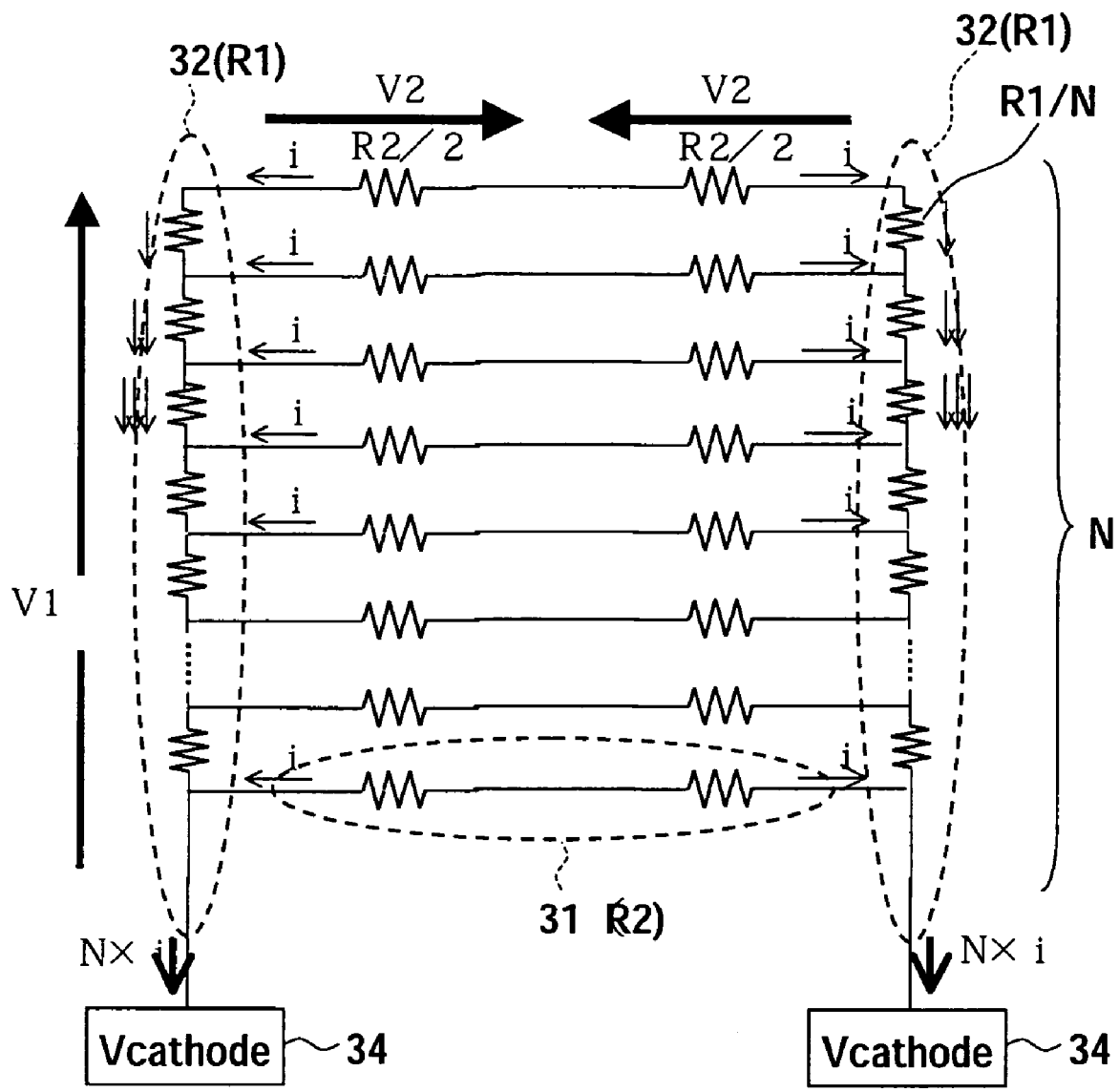
FIG. 7 is an equivalent circuit diagram of the bus lines shown in FIG. 5.

Note, in the example of the first interconnection of the bus line shown in FIG. 5, the necessary minimum width of the first cathode bus line 32 will be examined. FIG. 7 is an equivalent circuit diagram of the bus lines shown in FIG. 5.

The both right and left sides of the first cathode bus lines 32 have a combined resistance R1 in a vertical direction and the cathode interconnections 31 have a resistance R2 in a horizontal direction. Note that, in FIG. 5, the resistance of the first anode bus line 22 is described as a "R'1" and the resistance of the anode interconnection 21 is described as a "R'2".

As shown in FIG. 7, if a vertical resolution of the image display is the number of "n", there is the "n" number of the cathode interconnections 31. And the first cathode bus line 32 can be considered that the "n" number of resistors having the resistance of "R1/N" are connected in series. In the drawing, the arrow shows the appearance which the current flowed from the half portion of the left side of the pixels of the image display flows into the cathode interconnection 31 in the left direction of the image display and the current flowed from the half portion of the right side of the respective pixels of the image display flows into the cathode interconnection 31 in the right direction of the image display. Thus if considering the gradation tone, only the half portion of the left side of the equivalent circuit may be paid attention to and examined, so that the cathode interconnection 31 is paid attention to, and the half portion of the left side is considered as an interconnection having a resistance of "R2/2".

The current, i, which is needed for the white display flows into the respective cathode interconnections 31 then it is superposed in the first cathode bus line 32 successively and reaches the power supply terminal 34. Consequently, it is paid attention to the half portion of the left side of the equivalent circuit shown in FIG. 7, and then the following formulas will be defined.

$$V2 = R2/2 \times i \qquad \text{1-a}$$

$$V1 = R1/N \times \{i + 2i + 3i + \ldots + (N-1)i\} = (N-1)/2 \times R1 \times i \qquad \text{2-a}$$

Note that, the "V1" is indicated as a potential difference which generates at both sides of the first cathode bus line 32 and the "V2" is indicated as a potential difference which generates at a half length of the cathode interconnection 31. The resistance of the cathode interconnection 31 is set to a resistance so as to not cause a grayscale along the cathode interconnection 31 in the white display, so that a grayscale in the upper and lower direction of the image display due to the potential inclination of the first cathode bus line 32 does not occur if satisfying the following formulas.

$$V1 \leq V2 \qquad \text{3-a}$$

The following formula is obtained by the above formulas (1-a), (2-a) and (3-a).

$$R1 \leq R2/(N-1) \qquad \text{4-a}$$

On the other hand, a sheet resistance of the metal layer which forms the first cathode bus line 32 and the cathode interconnection 31 is indicated as a "ρ", the length of the cathode bus line (R1) is indicated as a "L1", the width thereof is indicated as a "W1", the length of the cathode line (R2) is indicated as a "L2" and the width thereof is indicated as a "W2", so that the "R1" and "R2" are defined by the following formulas.

$$R1=\rho \times L1/W1 \qquad \text{5-a}$$

$$R2=\rho > L2/W2 \qquad \text{6-a}$$

The width of the first cathode bus line 32 is defined by the above formulas (4-a), (5-a) and (6-a) as the following formula.

$$W1 \leq (N-1) \times L1/L2 \times W2 \sim N \times L1/L2 \times W2 \qquad \text{7-a}$$

If the formula (7-a) is adapted to the display device having the QVGA resolution, the width of the interconnection of the cathode bus line W1 may be 1.8 mm (W1≧240×(0.153×240)/(0.51×3×320)×0.01=1.8). However, clearly if referring the formula (4-a), the width of the first cathode bus line 32 is equivalent to the one simply superimposed the number n (240) of the cathode interconnection 31 in the formula (7-a). This is not a technique for making the width of the bus line narrower.

[Example of Second Interconnection of Bus Line]

Figure 8:
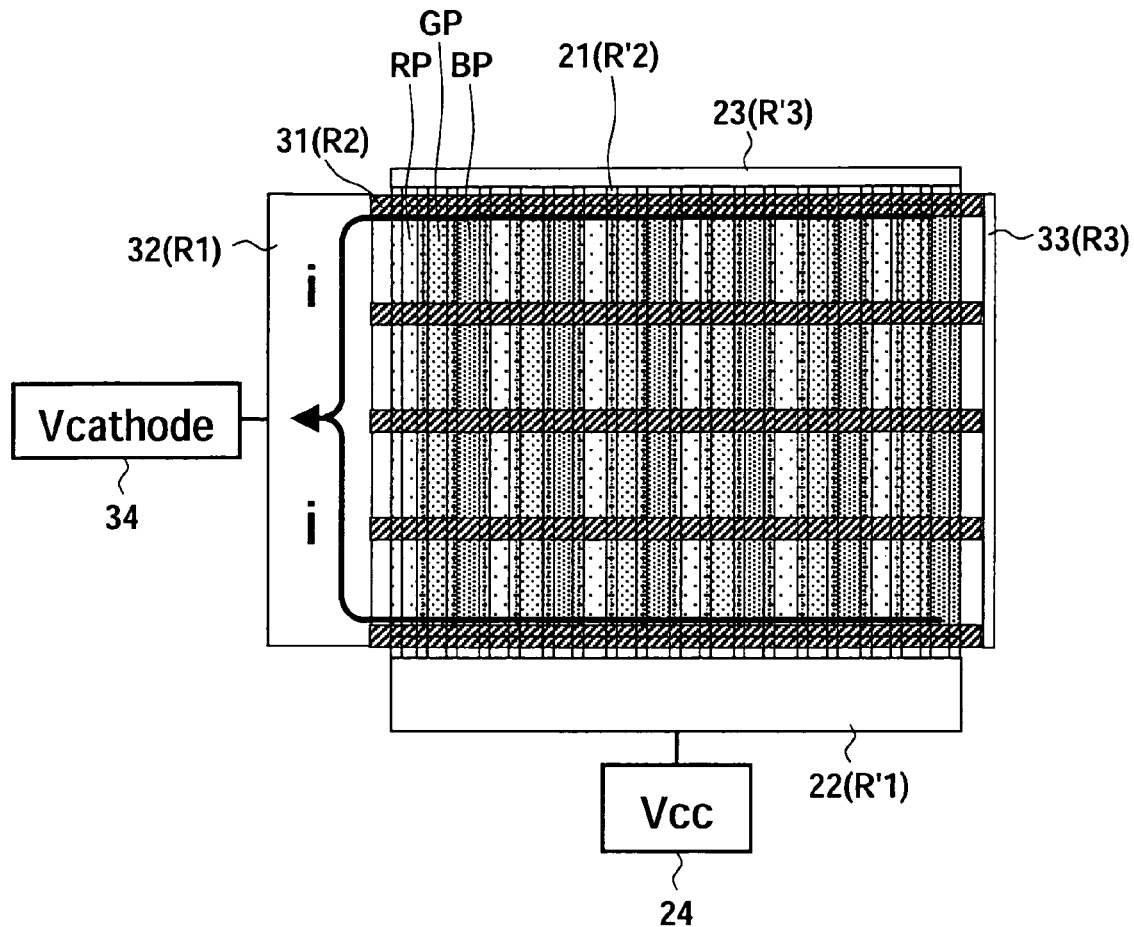
FIG. 8 is a view of an example of a second interconnection of the cathode bus line and the anode bus line.

FIG. 8 is a view of a preferable example of a second interconnection of a cathode bus line and an anode bus line for improving the above.

In the example of the interconnection shown in FIG. 8, the first cathode bus line 32 which respectively connects to the left sides of a plurality of the cathode interconnections 31 extending in the lateral direction and wherein current flows substantially, and the cathode bus line 33 which respectively connects to the right sides of the cathode interconnections 31 and suppresses a variation of the potential difference of the right side of the cathode interconnection 31 are provided at outside of the display region Ar. Further, the power supply terminal 34 which connects to the middle portion of the first cathode bus line 32 is provided.

The first anode bus line 22 which respectively connects to the lower sides of a plurality of the anode interconnections 21 extending in the longitudinal direction and wherein current flows substantially, and the second anode bus line 23 which respectively connects to the upper sides of the plurality of the anode interconnections 21 and suppresses a variation of the potential difference of the upper side of the anode interconnection 21 are provided at outside of the display region Ar. Further, the power supply terminal 24 which connects to the middle portion of the first anode bus line 22 is provided.

Figure 9:
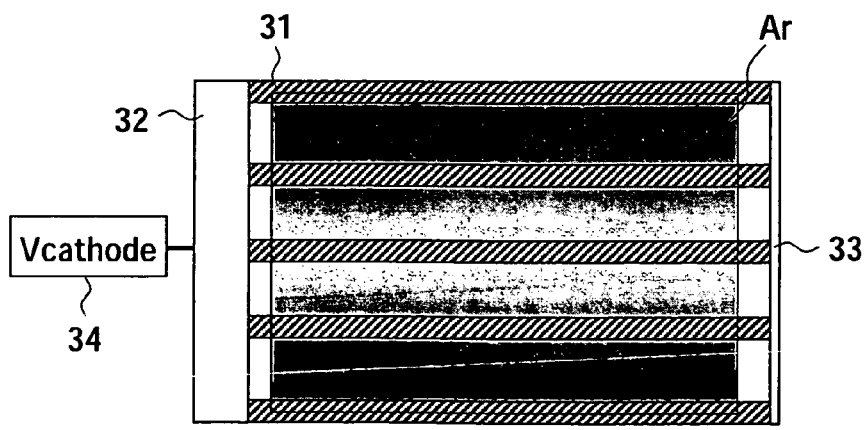
FIG. 9 is a schematic view of a gray-scaled display by the interconnection shown in FIG. 8.

In the configuration shown in FIG. 8, if the resistance of the cathode bus line is high, the grayscale in the upper and lower directions of the image display shown in FIG. 9 occurs as same as FIG. 5. However, due to this configuration, the gradation can be prevented by a narrower width of the interconnection than the first cathode bus line of FIG. 5.

The configuration shown in FIG. 8 is asymmetrical in that the power supply terminal 34 is provided only for one first cathode bus line 32, so that the other second cathode bus line 33 rarely contributes as the current path. In the white display, the current which flows into the cathode interconnection 31 flows in the left direction of the image display to superpose the left side of the bus line and reaches the power supply terminal 34.

The second cathode bus line 33 is provided for suppressing a variation of the potential difference of the right side of the cathode interconnection 31, it may be set so as to be R3<R2. Note that, the "R2" is indicated as the resistance of the cathode interconnection 31 and the "R3" is indicated as the resistance of the second cathode bus line 33.

The example of the second interconnection differs from the first interconnection (refer to FIG. 5). Namely, the widths of the left and right sides of the first cathode bus line 32 may not be same, and even if the width of the interconnection of the second cathode bus line 33 is extremely reduced, the influence may be small. Therefore, the frame width can be made narrower.

Figure 10:
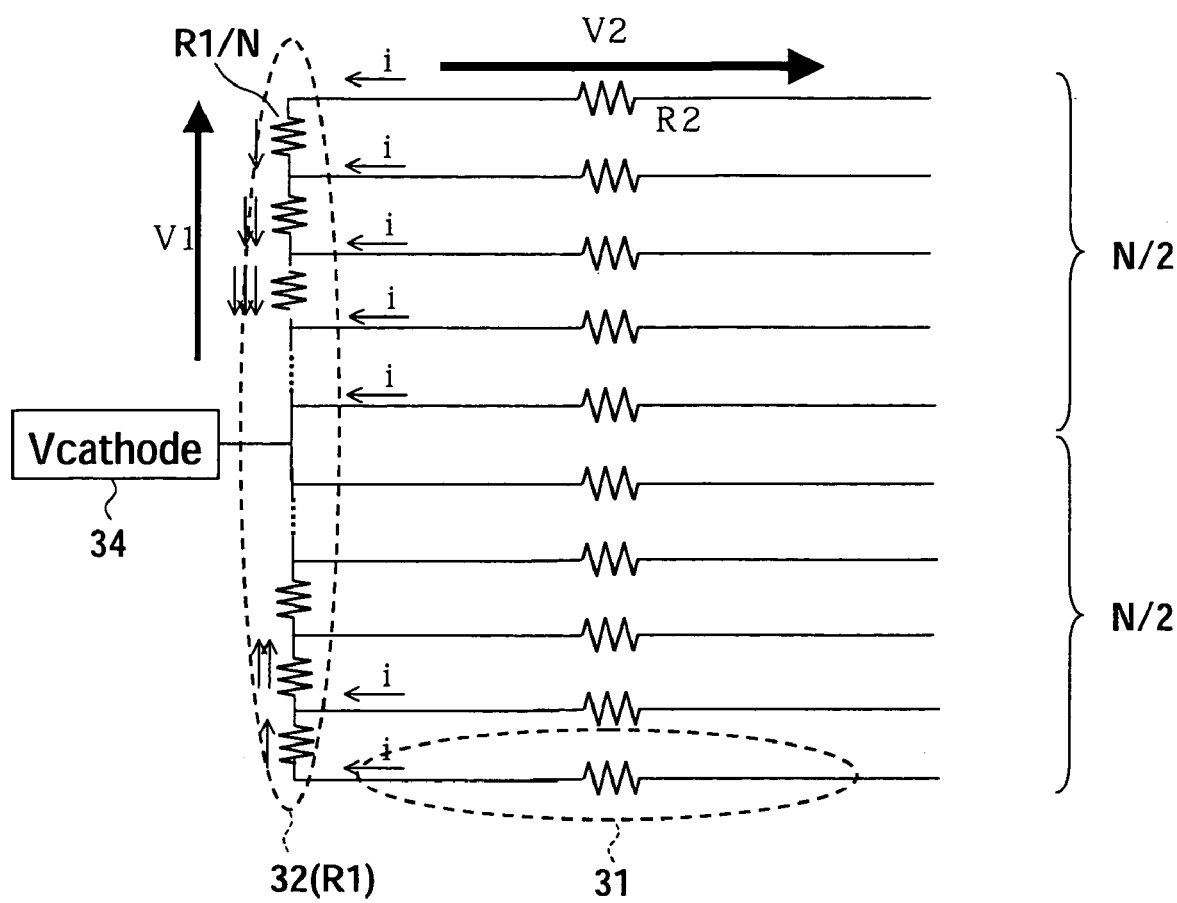
FIG. 10 is an equivalent circuit diagram of the bus lines shown in FIG. 8.

With respect to the example of the second interconnection shown in FIG. 8, the width of the interconnection of the first cathode bus line 32 which is provided with the power supply terminal side 34 is calculated to be the minimum necessary. The equivalent circuit in this case is indicated as shown in FIG. 10 since the contribution of the second cathode bus line 33 is free from providing the power supply terminal 34 to the extent that it can be disregarded. The potential difference V2 of the both sides of the cathode interconnection 31 is defined by the following formula.

$$V2=R2 \times i \qquad \text{1-b}$$

The first cathode bus line 32 has the power supply terminal 34 in the middle portion of the bus line, so that it only may be able to prevent the gradation in the half portion of the upper side of the first cathode bus line 32. Then the potential difference thereof is defined by the following formula.

$$V1=(1+2+3+\ldots+N/2) \times i \times R1/N = N/2 \times (N/2+1)/2 \times i \times R1/N = (N+2)/8 \times i \times R1 \qquad \text{2-b}$$

The gradation in the right and left direction of the image display, or along the cathode interconnection 31, does not occur as mentioned above. Therefore, if satisfying the following relation between the potential differences V1 and V2, the grayscale in the upper and lower directions of the image display can be restricted.

$$V1 \leq V2 \qquad \text{3-b}$$

Therefore, the following formula is obtained by the above formulas (1-b) and (2-b).

$$R1 \leq 8/(N+2) \times R2 \sim 8/N \times R2 \qquad \text{4-b}$$

On the other hand, a sheet resistance of the metal layer which forms the first cathode bus line 32 and the cathode interconnection 31 is indicated as a "ρ", the length of the cathode bus line 32 (R1) is indicated as a "L1", the width thereof is indicated as a "W1", the length of the cathode interconnection 31 (R2) is indicated as a "L2" and the width thereof is indicated as a "W2", so that the "R1" and "R2" are defined by the following formulas.

$$R1=\rho \times L1/W1 \qquad \text{5-b}$$

$$R2=\rho \times L2/W2 \qquad \text{6-b}$$

From the above formulas (4-b), (5-b) and (6-b), the width of the interconnection of the first cathode bus line 32 is defined by the following formula.

$$W1 \geq (N+2)/8 \times L1/L2 \times W2 \sim N/8 \times L1/L2 \times W2 \qquad \text{7-b}$$

Due to the above method, the gradation can be prevented by the narrower width of the interconnection of the first cathode bus line 32 than the case of the formula (7-a). For example, if it is adapted to the display device having the QVGA resolution, the width W1 of the first cathode bus line 32 may be almost 0.23 mm. Consequently, the gradation can be sufficiency prevented by the width of the interconnection.

In the first anode bus line 22, the potential inclination which occurs in the first anode bus line 22 is reduced when the current flows into the pixel, so that the gradation in the right and left directions of the image display can be prevented. The above explanation for the first cathode bus line 32 will be applied to this even without explaining in detail.

The top emission type was described above. Next an application for the bottom emission type will be described.

In the case of the bottom emission type, light from the luminous layer 40 shown in FIG. 1 is obtained at the insulation substrate side 1. Therefore, a transparent insulation substrate is employed as the insulation substrate 1. Further, ITO or other transparent electrode types may be employed as the anode electrode 20 and a metal film or other highly reflective materials may be employed as the cathode electrode 30.

The bottom emission type is not substantially suitable to secure an area of the luminous layer of the pixel in large due to its configuration, and further, it is not suitable for simultaneously providing a circuit for additional operations under the luminous layer by using a formation process for the pixel transistor.

However, in the case of application to the bottom emission type, this technique in which the anode interconnection 21 and the cathode interconnection 31 are crossed and the cathode interconnection 31 is made as a lateral interconnection is set to a technique for contributing to the maximization of the area of the luminous layer in the respective pixels. Note that, as mentioned in related art, the cathode electrode 30 of the bottom emission type (in this case, a metal electrode) does not have to be made a stripe shape as usual, and thus it is not restricted. Further the bottom emission type can be applied to making the resistance of the bus line lower.

The present invention is not limited to the above embodiments. For example, the respective color pixels of R, G and B may employ the luminous layer 40 emitting different wavelengths of light, and they may be formed with a color filter passing though the respective wavelengths of light of R, G and B on the luminous layer 40 emitting white light. And if the rectifier characteristic of the luminous layer 40 is reversed, the anode and the cathode mentioned in the present embodiment may be reversed and they are not limited.

It should be understood by those skilled in the art that various modifications, combinations, sub-combinations and alterations may occur depending on design requirements and other factors in so far as they are within scope of the appeared claims or the equivalents thereof.

What is claimed is:

1. A display device comprising:
a plurality of luminous elements, each luminous element including:
  a first electrode formed on a substrate and defining a luminous region and connected to a first electrode interconnection;
  a transparent second electrode connected to a pair of second electrode interconnections positioned at opposite ends of the luminous element, and a portion of said transparent second electrode facing said first electrode;
  a luminous layer arranged between said first electrode and said second electrode; and
  a display region in which the plurality of luminous elements are arranged in a first direction and a second direction to form a matrix, and light is produced from the luminous layers in the plurality of luminous elements on the side opposite of said substrate, wherein said display region includes
a plurality of first electrode interconnections extending in said first direction providing a first steady potential voltage and respectively connected to a plurality of said first electrodes arranged in said first direction, and
a plurality of second electrode interconnections extending in said second direction providing a second steady potential voltage and respectively connected to a plurality of said second electrodes arranged in said second direction; and wherein an area outside of said display region comprises:
a first bus line connected to one side of a plurality of said second electrode interconnections extending in said second direction and providing a current flow, and
a second bus line connected to another side of a plurality of said second electrode interconnections extending in said second direction and for suppressing a variation of a voltage potential of said second electrode interconnection,
wherein a resistance of said first bus line and a resistance of said second bus line are defined so as to satisfy the following formula:

$R1 \leq 8 \times R2/N;$ $R3 < R2$, wherein

Note that, in the above formula, said "R1" is indicated as a resistance of said first bus line, said "R2" is indicated as a resistance of said second electrode interconnection, said "R3" is indicated as a resistance of said second bus line and said "N" is indicated as a number of said second electrode interconnection.

2. A display device as set forth in claim 1, wherein the respective pixels comprise three luminous elements which are arranged in said second direction.

3. A display device as set forth in claim 1 further comprising a power supply terminal connected to a middle portion of said first bus line.

4. A display device as set forth in claim 1, wherein an area outside of said display region comprises:
a first bus line connected to one side of a plurality of said first electrode interconnections extending in said first direction and providing a steady current flow; and
a second bus line connected to another side of a plurality of said first electrode interconnections extending in said first direction and for suppressing a variation of a voltage potential of the first electrode interconnection.

5. A display device as set forth in claim 4, wherein a resistance of said first bus line and a resistance of said second bus line are defined so as to satisfy the following formula:

$R1 \leq 8 \times R2/N;$ $R3 < R2$, wherein

Note that, in the above formula, said "R1" is indicated as a resistance of said first bus line, said "R2" is indicated as a resistance of said first electrode interconnection, said "R3" is indicated as a resistance of said second bus line and said "N" is indicated as a number of said first electrode interconnection.

6. A display device as set forth in claim 5 further comprising a power supply terminal connected to a middle portion of said first bus line.

7. A display device as set forth in claim 1 further comprising two bus lines connected respectively to a plurality of said second electrode interconnections extending in said second direction at the outside of said display region.

8. A display device as set forth in claim 7, wherein a resistance of said bus lines is defined so as to satisfy the following formula:

$R \leq R2/N-1)$, wherein

Note that, in the above formula, said "R1" is indicated as a resistance of said bus lines, said "R2" is indicated as a resistance of said second electrode interconnection and said "N" is indicated as a number of said second electrode interconnection.

9. A display device as set forth in claim 8 further comprising two power supply terminals connected to the respective bus lines.

10. A display device as set forth in claim 1 further comprising two bus lines connected to a plurality of said first electrode interconnections extending in said first direction at outside of said display region.

11. A display device as set forth in claim 10, wherein a resistance of said bus lines is defined so as to satisfy the following formula:

$R1 \leq R2/(N-1)$, wherein

Note that, in the above formula, said "R1" is indicated as a resistance of said bus lines, said "R2" is indicated as a resistance of said first electrode interconnection and said "N" is indicated as a number of said first electrode interconnection.

12. A display device as set forth in claim 11 further comprising a power supply terminal connected to a single bus line.

13. A display device comprising:
a plurality of luminous elements, each luminous element including:
a first electrode connected to a first electrode interconnection;
a second electrode facing said first electrode and connected to at least one second electrode interconnection positioned on at least one end of the luminous element;
a luminous layer arranged between said first electrode and said second electrode; and
a display region in which the plurality of luminous elements are arranged in a first and second direction in matrix, the first direction being perpendicular to the second direction, wherein said display region includes:
a plurality of first electrode interconnections extending in said first direction and connected respectively to a plurality of said first electrodes arranged in said first direction, and
a plurality of second electrode interconnections extending in said second direction and connected respectively to a plurality of said second electrodes arranged in said second direction; wherein an area outside of said display region comprises:
a first bus line connected to one side of a plurality of said second electrode interconnections extending in said second direction and providing a current flow, and
a second bus line connected to another side of a plurality of said second electrode interconnections extending in said second direction and for suppressing a variation of a voltage potential of said second electrode interconnection;
wherein a resistance of said first bus line and a resistance of said second bus line are defined so as to satisfy the following formula:

$R1 \leq 8 \times R2/N$;

$R3 \leq R2$, wherein

Note that, in the above formula, said "R1" is indicated as a resistance of said first bus line, said "R2" is indicated as a resistance of said second electrode interconnection, said "R3" is indicated as a resistance of said second bus line and said "N" is indicated as a number of said second electrode interconnection.

14. A display device as set forth in claim 1, wherein at least one of the second electrode interconnections, from the pair of second electrode interconnections associated with each luminous element, is positioned between the luminous elements and an adjacent luminous element.

15. A display device comprising:
a plurality of luminous elements, each luminous element including:
an anode electrode formed on a substrate and defining a luminous region and connected to an anode interconnection through a thin-film-transistor;
a transparent cathode electrode connected to a pair of cathode interconnections positioned at opposite ends of the luminous element, and a portion of said transparent cathode electrode facing said anode electrode;
a luminous layer arranged between said anode electrode and said cathode electrode; and
a display region in which the plurality of luminous elements are arranged in a first direction and a second direction to form a matrix, and light is produced from the luminous layers in the plurality of luminous elements layer on the side opposite of said substrate, wherein said display region includes:
a plurality of anode electrode interconnections extending in said first direction and respectively connected to a plurality of said anode electrodes arranged in said first direction, and
a plurality of cathode electrode interconnections extending in said second direction and is connected to a plurality of said cathode electrodes arranged in said second direction;
wherein an area outside of said display region comprises:
a first bus line connected to one side of a plurality of said cathode electrode interconnections extending in said second direction and providing a current flow, and
a second bus line connected to another side of the plurality of said cathode electrode interconnections extending in said second direction and for suppressing a variation of a voltage potential of said second electrode interconnection;
wherein a resistance of said first bus line and a resistance of said second bus line are defined so as to satisfy the following formula:

$R1 \leq 8 \times R2/N$;

$R3 < R2$, wherein

Note that, in the above formula, said "R1" is indicated as a resistance of said first bus line, said "R2" is indicated as a resistance of said second electrode interconnection, said "R3" is indicated as a resistance of said second bus line and said "N" is indicated as a number of said second electrode interconnection.

* * * * *